US010162011B2

(12) United States Patent
Yang et al.

(10) Patent No.: US 10,162,011 B2
(45) Date of Patent: Dec. 25, 2018

(54) ACCELERATED LIFETIME TEST DEVICE FOR REDOX FLOW BATTERY

(71) Applicant: KOREA INSTITUTE OF ENERGY RESEARCH, Daejeon (KR)

(72) Inventors: Junghoon Yang, Daejeon (KR); Hyeonsun Yang, Daejeon (KR); Changsoo Jin, Daejeon (KR); Bumsuk Lee, Daejeon (KR); Myungseok Jeon, Daejeon (KR); Kyounghee Shin, Daejeon (KR); Kyunam Jung, Daejeon (KR); Sunhwa Yeon, Sejong-si (KR); Chanwoo Lee, Daejeon (KR)

(73) Assignee: KOREA INSTITUTE OF ENERGY RESEARCH, Daejeon (KR)

( * ) Notice: Subject to any disclaimer, the term of this patent is extended or adjusted under 35 U.S.C. 154(b) by 91 days.

(21) Appl. No.: 15/489,957

(22) Filed: Apr. 18, 2017

(65) Prior Publication Data

US 2017/0309936 A1 Oct. 26, 2017

(30) Foreign Application Priority Data

Apr. 20, 2016 (KR) .......................... 10-2016-0047973

(51) Int. Cl.
| *H01M 8/18* | (2006.01) |
| *H01M 8/04* | (2016.01) |
| *G01R 31/36* | (2006.01) |
| *H01M 8/04298* | (2016.01) |

(52) U.S. Cl.
CPC .... *G01R 31/3627* (2013.01); *H01M 8/04305* (2013.01); *H01M 8/18* (2013.01); *Y02E 60/528* (2013.01)

(58) Field of Classification Search
CPC .......... G01R 31/3627; H01M 8/04305; H01M 8/18; H01M 10/4285; H01M 8/188; H01M 8/04641; H01M 8/04276; H01M 8/04194

See application file for complete search history.

(56) References Cited

U.S. PATENT DOCUMENTS

| 2005/0175890 A1* | 8/2005 | Tsutsumi | H01M 2/385 |
| | | | 429/101 |
| 2012/0003518 A1* | 1/2012 | Fischel | H01M 2/38 |
| | | | 429/69 |

FOREIGN PATENT DOCUMENTS

KR 101494188 B1 2/2015

* cited by examiner

*Primary Examiner* — Gregg Cantelmo
(74) *Attorney, Agent, or Firm* — Hauptman Ham, LLP

(57) ABSTRACT

The accelerated lifetime test device for a redox flow battery according to the present invention includes a test cell including a separator configured to exchange ions contained in an electrolyte, first and second manifolds disposed on both side surfaces of the separator and having openings through which the electrolyte flows, a cathode disposed on an outer side surface of the first manifold, an anode disposed on an outer side surface of the second manifold, and first and second end plates respectively disposed on outer side surfaces of the cathode and the anode, a rotator configured to uniformly disperse the electrolyte included in the test cell by rotating the test cell and a tester connected to each of the cathode and the anode of the test cell and configured to test performance of the test cell.

6 Claims, 5 Drawing Sheets

ACCELERATED LIFETIME TEST DEVICE FOR REDOX FLOW BATTERY

CROSS-REFERENCE TO RELATED APPLICATION

This application claims priority to and the benefit of Korean Patent Application No. 10-2016-0047973 filed in the Korean Intellectual Property Office on Apr. 20, 2016 respectively, the entire contents of which are incorporated herein by reference.

The present invention relates to an accelerated lifetime test device for a redox flow battery, and more particularly, to an accelerated lifetime test device for a redox flow battery capable of performing a lifetime test on a redox flow battery in a short time.

Redox flow batteries are large-capacity energy storage devices and are essential for efficient operation of renewable energy such as solar power or wind power in which it is difficult to maintain constant output and capacity due to weather and time.

Among such redox flow batteries, a zinc-bromine flow battery using zinc and bromine, along with a vanadium redox flow battery, is one among the redox flow batteries closest to commercialization. Specifically, zinc-bromine flow batteries show high price competitiveness based on a low electrolyte price and have far superior advantages to flow batteries having different output voltages and output energy densities.

However, zinc-bromine flow batteries have a characteristic in which a phase of the battery transitions to another phase while an active material (cathode: zinc ions; anode: bromine ions) dissolved in an electrolyte is charged. That is, zinc ions are electrodeposited with solid-phase metal zinc and bromine ions are separated into an oily phase while forming a complex compound with an ionic liquid. In this process, it is estimated that deactivation of electrodes used in the battery occurs. Specifically, it has been confirmed that the performance of the anode is gradually reduced due to the formed oil phase complex compound.

Therefore, in order to steadily operate a zinc-bromine flow battery, it is required to search for an anode material having excellent stability with respect to the electrolyte used.

Recently, despite many studies on anode materials having excellent stability, there have been difficulties in the progress of such studies because the characteristics of the long-term stability test of zinc-bromine flow batteries requires great amounts of time. For example, when an end cell having an electrode area of 35 $cm^2$ is used, it takes about 8 hours or more to charge and discharge SCO up to 40%. Since operations for several hundred cycles or more are generally required in order to confirm electrode performance deactivation under these conditions, there is a problem in that it takes about five months or more for one test of 500 cycles.

DOCUMENT OF RELATED ART

Patent Document

Korean Patent Registration No. 10-1494188 (registered on Feb. 11, 2015)

The present invention is directed to providing an accelerated lifetime test device for a redox flow battery capable of performing a lifetime test on a redox flow battery in a short time.

One aspect of the present invention provides an accelerated lifetime test device for a redox flow battery, which includes a test cell including a separator configured to exchange ions contained in an electrolyte, first and second manifolds disposed on both side surfaces of the separator and having openings through which the electrolyte flows, a cathode disposed on an outer side surface of the first manifold, an anode disposed on an outer side surface of the second manifold, and first and second end plates respectively disposed on outer side surfaces of the cathode and the anode, a rotator configured to uniformly disperse the electrolyte included in the test cell by rotating the test cell, and a tester connected to each of the cathode and the anode of the test cell and configured to test performance of the test cell.

In the accelerated lifetime test device for a redox flow battery according to the present invention, an active material of the cathode may include zinc ions and an active material of the anode may include bromine ions.

In the accelerated lifetime test device for a redox flow battery according to the present invention, the rotator may include a rotating unit configured to uniformly disperse the electrolyte included in the test cell by rotating the test cell, a driving unit configured to drive the rotating unit, and a manipulating unit configured to control an operation of the driving unit.

In the accelerated lifetime test device for a redox flow battery according to the present invention, the rotating unit may rotate the test cell at a speed of 1 to 10,000 rpm within a range from −180 to +180 degrees.

In the accelerated lifetime test device for a redox flow battery according to the present invention, the rotating unit may rotatably move the test cell 10 left or right at a predetermined angle.

In the accelerated lifetime test device for a redox flow battery according to the present invention, the rotating unit may include a supporter, a rotating shaft rotatably coupled to the supporter and rotated by the driving unit, and an accommodation unit fixedly coupled to the rotating shaft and configured to accommodate the test cell.

In the accelerated lifetime test device for a redox flow battery according to the present invention, a separate electrolyte tank for supplying an electrolyte need not be provided, a test cell 10 including a separator 11 which exchanges ions contained in the electrolyte, first and second manifolds 12 and 13 which are disposed on both side surfaces of the separator 11 and have openings through which the electrolyte flows, a cathode 14 disposed on an outer side surface of the first manifold 12, an anode 15 disposed on an outer side surface of the second manifold 13, and first and second end plates 17 and 18 which are respectively disposed on outer side surfaces of the cathode 14 and the anode 15 can be implemented, and thus charging and discharging times can be reduced by performing charging and discharging through a small amount of an electrolyte as compared to a redox flow battery to be tested.

That is, in the accelerated lifetime test device for a redox flow battery according to the present invention, a non-flow battery can be implemented under the same conditions as the redox flow battery to be tested and thus the charging and discharging times can be reduced.

Also, the accelerated lifetime test device for a redox flow battery according to the present invention can include the rotating unit for rotating the test cell, and can uniformly disperse the electrolyte inside the test cell by rotating the test cell 10 during the charging and discharging processes.

DETAILED DESCRIPTION

The following description will focus on configurations necessary for understanding operations according to embodiments of the present invention. Therefore, descriptions of other configurations that might obscure gist of the present invention will be omitted.

Terms and words used in this specification and claims should not be interpreted as limited to commonly used meanings or meanings in dictionaries and should be interpreted with meanings and concepts which are consistent with the technological scope of the invention based on the principle that the inventors have appropriately defined concepts of terms in order to describe the invention in the best way. Therefore, since the embodiments described in this specification and configurations illustrated in drawings are only exemplary embodiments and do not represent the overall technological scope of the invention, it should be understood that the invention covers various equivalents and modifications at the time of filing of this application.

Hereinafter, embodiments of the present invention will be described in more detail with reference to the accompanying drawings.

Figure 1:
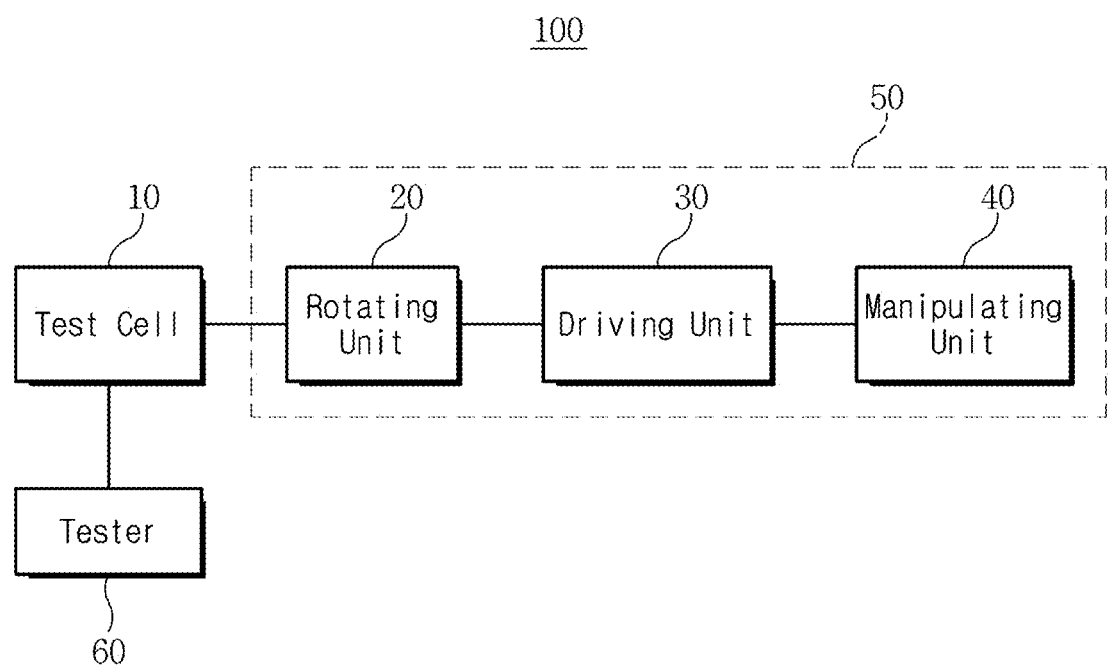
FIG. 1 is a block diagram illustrating an accelerated lifetime test device for a redox flow battery according to an embodiment of the present invention.
Figure 2:
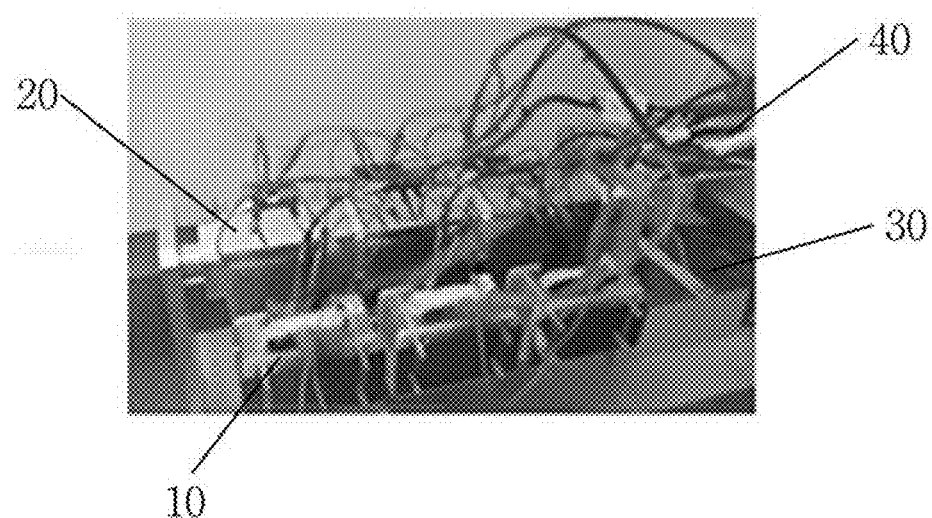
FIG. 2 is a photograph illustrating the accelerated lifetime test device for a redox flow battery according to the embodiment of the present invention.
Figure 3:
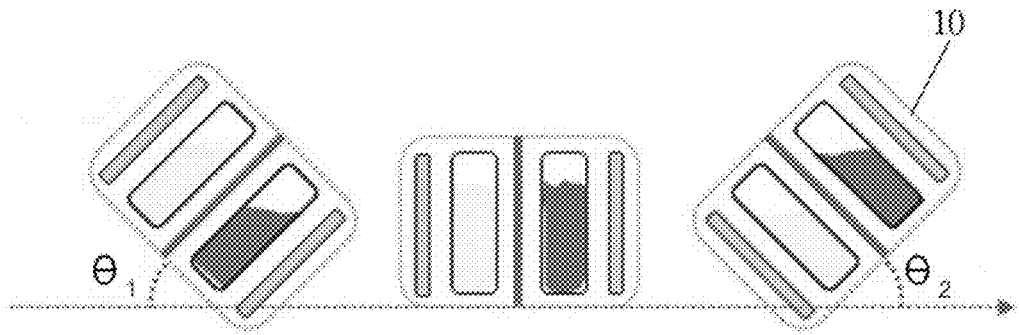
FIG. 3 illustrates schematic diagrams illustrating a state in which a rotator of the accelerated lifetime test device for a redox flow battery according to the embodiment of the present invention rotates a test cell.
Figure 4:
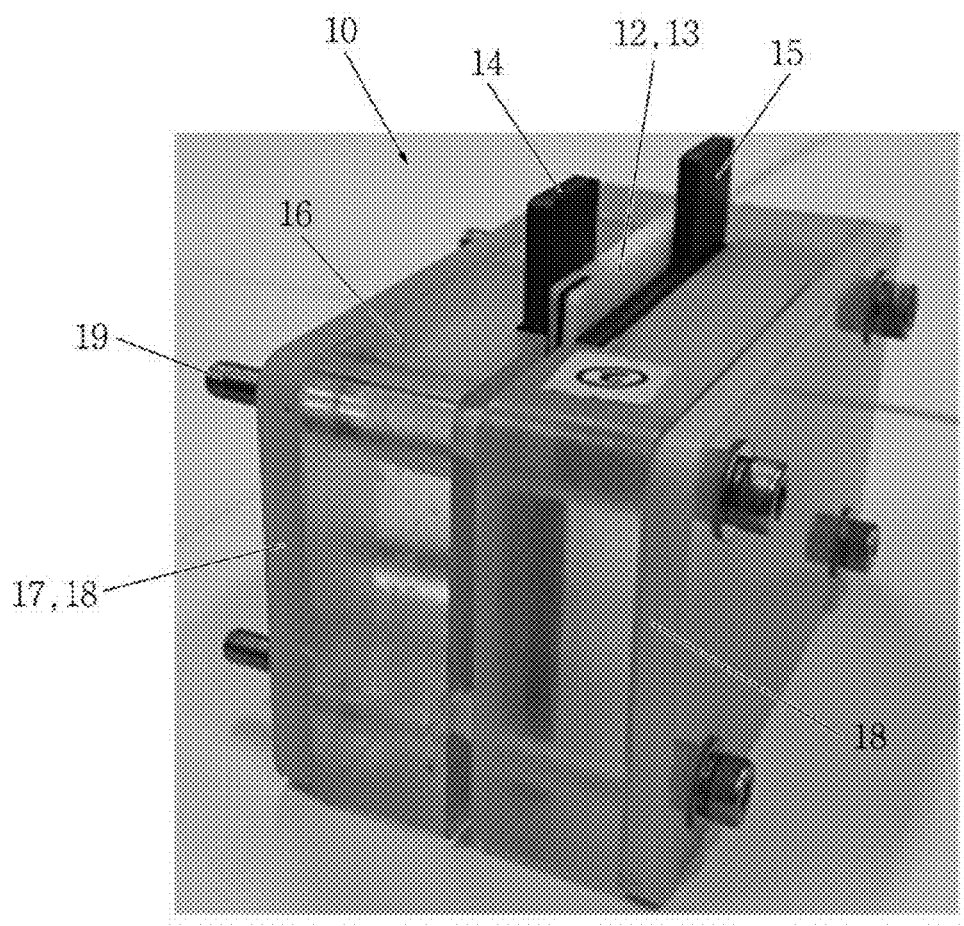
FIG. 4 is a schematic diagram illustrating a rotating unit of the accelerated lifetime test device for a redox flow battery according to the embodiment of the present invention.

FIG. 1 is a block diagram illustrating an accelerated lifetime test device for a redox flow battery according to an embodiment of the present invention, FIG. 2 is a photograph illustrating the accelerated lifetime test device for a redox flow battery according to the embodiment of the present invention, FIG. 3 illustrates schematic diagrams illustrating a state in which a rotator of the accelerated lifetime test device for a redox flow battery according to the embodiment of the present invention rotates a test cell, and FIG. 4 is a schematic diagram illustrating a rotating unit of the accelerated lifetime test device for a redox flow battery according to the embodiment of the present invention.

Referring to FIGS. 1 to 4, an accelerated lifetime test device 100 for a redox flow battery according to the embodiment of the present invention includes a test cell 10, a rotator 50, and a tester 60.

The test cell 10 refers to a cell which is implemented under the same conditions as a redox flow battery to be tested in order to evaluate the performance of the redox flow battery. The test cell 10 may include the same components as a separator, manifolds, a cathode, an anode, and end plates of the redox flow battery to be tested and may not include an electrolyte tank separately.

That is, the test cell 10 may include the same components as those of the redox flow battery to be tested, may not include an electrolyte tank, and may be formed as a non-flow battery rather than a flow battery. Thus, a lifetime test of an electrode may be performed in a short time.

Meanwhile, when the redox flow battery to be tested is directly used for performing a lifetime test on the electrode, much time may be spent performing charging and discharging. For example, when an end cell having an electrode area of 35 $cm^2$ is used, it takes about eight hours or more to charge and discharge SCO up to 40%. Since operations of several hundred cycles or more are generally required in order to confirm electrode deactivation performance under these conditions, there is a problem in that it takes about five months or more for one test of 500 cycles.

Accordingly, since the test cell 10 according to the embodiment of the present invention does not include an electrolyte tank and is implemented as a cell through a small amount of an electrolyte, charging and discharging times may be reduced.

Accordingly, the test cell 10 according to the embodiment of the present invention may evaluate lifetime characteristics in a short time by reducing the charging and discharging times.

The rotator 50 may uniformly disperse an electrolyte included in the test cell 10 by rotating the test cell 10.

The rotator 50 includes a rotating unit 20, a driving unit 30, and a manipulating unit 40.

As illustrated in FIG. 3, the rotating unit 20 may be formed to accommodate a plurality of test cells 10 and may uniformly disperse the electrolyte included in the test cell 10 by rotating the test cell 10.

Here, the rotating unit 20 may rotate the test cell 10 at a speed of 1 to 10,000 rpm within a range from −180 to +180 degrees. In this case, a temperature of the rotating unit 20 may be set according to an environment in which the redox flow battery to be tested is used and a rotation speed of the rotating unit 20 may be set according to a characteristic of the electrolyte.

The rotating unit 20 may rotatably move the test cell 10 left or right at a predetermined angle. For example, as illustrated in FIG. 3, the rotating unit 20 may rotatably move the test cell 10 45 degrees to the left or 45 degrees to the right.

The rotating unit 20 may uniformly disperse the electrolyte by rotating the test cell 10 and also promote charging and discharging of the test cell 10, and thus a lifetime characteristic of the test cell 10 may be evaluated in a short time.

The rotating unit 20 may include a supporter 21, a rotating shaft 22, and an accommodation unit 23.

The supporter 21 may be fixed to the ground. The rotating shaft 22 is rotatably coupled to the supporter 21 fixed to the ground. Here, the rotating shaft 22 may be connected to the driving unit 30 to rotatably move. The accommodation unit 23 may be fixedly coupled to the rotating shaft 22 to accommodate the test cell 10.

The rotating unit 20 according to the embodiment of the present invention is configured to rotate the test cell 10 by the supporter 21, the rotating shaft 22, and the accommodation unit 23, but the present invention is not limited thereto, and any component for rotating the test cell 10 at a predetermined angle may be applied as the rotating unit 20.

The driving unit 30 may drive the rotating unit 20. The driving unit 30 may include a stepping motor and a reducer so that the rotating unit 20 may be smoothly moved at a predetermined angle.

Here, the stepping motor is a motor which rotates the rotating unit 20 by a predetermined angle according to an applied pulse, and may rotate the rotating unit 20 at a predetermined angle. The reducer may transmit power of the stepping motor to the rotating unit 20 so that the rotating unit 20 may be rotated.

The manipulating unit 40 may control the driving unit 30. For example, the manipulating unit 40 may include a plurality of buttons to perform ON/OFF control, rotation angle control, speed control, and the like.

The tester 60 may be connected to each of a cathode and an anode of the test cell 10 to test the performance of the test cell 10. That is, the tester 60 may test the performance of the test cell 10 by analyzing measured values obtained from the cathode and the anode.

Hereinafter, a configuration of the test cell 10 according to the embodiment of the present invention will be described in more detail.

Figure 5:
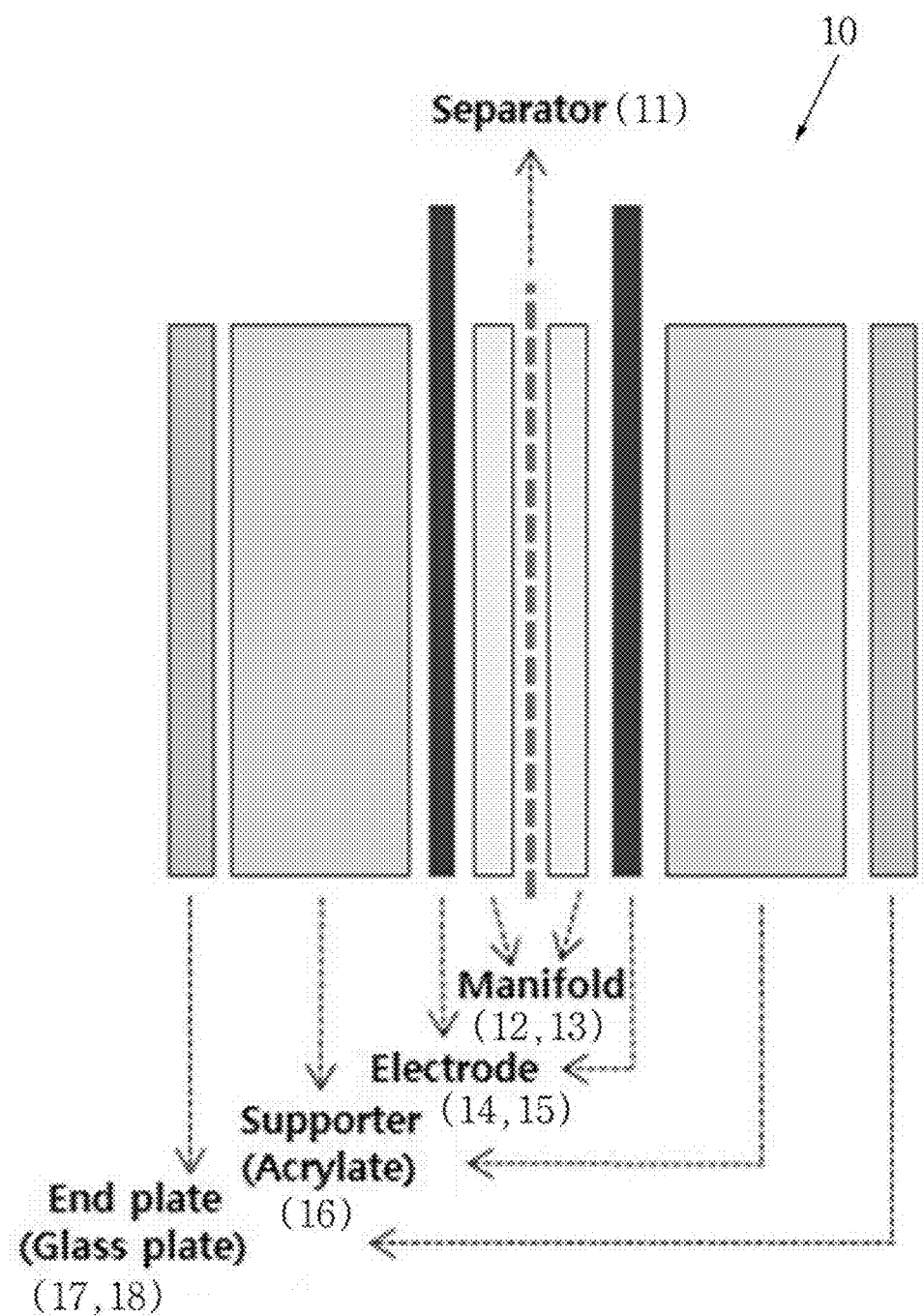
FIG. 5 is a photograph illustrating a test cell of the accelerated lifetime test device for a redox flow battery according to the embodiment of the present invention.
Figure 6:
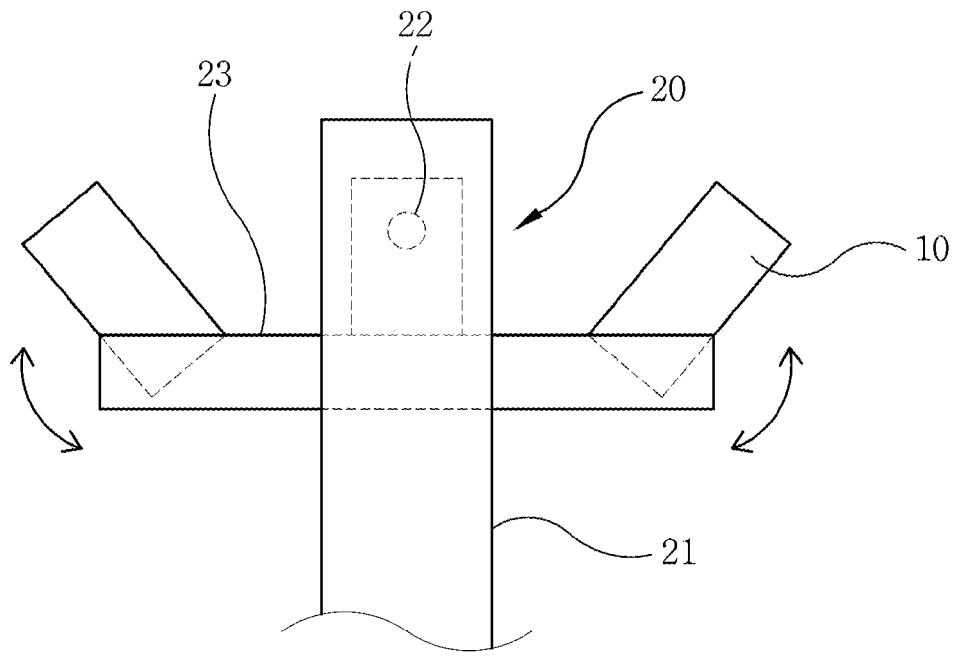
FIG. 6 is a schematic diagram illustrating a structure of the test cell of the accelerated lifetime test device for a redox flow battery according to the embodiment of the present invention.

FIG. 5 is a photograph illustrating a test cell of the accelerated lifetime test device for a redox flow battery according to the embodiment of the present invention and FIG. 6 is a schematic diagram illustrating a structure of the test cell of the accelerated lifetime test device for a redox flow battery according to the embodiment of the present invention.

Referring to FIGS. 5 and 6, the test cell 10 according to the embodiment of the present invention includes a separator 11, first and second manifolds 12 and 13, a cathode 14, an anode 15, and first and second end plates 17 and 18.

The separator 11 may allow ions to be exchanged between the cathode and the anode. That is, the separator 11 may be a porous membrane, and may serve to prevent an anode active material and a cathode active material from moving toward the counter electrode by preventing the cathode 14 and the anode 15 from coming in direct contact with each other and to smoothly flow a current by transmitting the ions therethrough.

Meanwhile, an electrolyte containing bromine (Br) ions may be used as an electrolyte of the cathode 14, and an electrolyte containing zinc (Zn) ions may be used as an electrolyte of the anode 15.

The first and second manifolds 12 and 13 may be disposed at both sides of the separator 11, and openings through which an electrolyte flows may be formed in central portions of the first and second manifolds 12 and 13. The opening of each of the first and second manifolds 12 and 13 may be formed so that one side thereof is coupled to the cathode 14 or the anode 15 and the other side is coupled to the separator 11, and may support ion exchange of the respective electrodes through the separator 11.

Also, although not illustrated, an electrolyte injection hole for injecting an electrolyte may be formed in the first or second manifold 12 or 13. The electrolyte may be injected through the electrolyte injection hole and then injected into the opening.

The cathode 14 is disposed on an outer side surface of the first manifold 12 and a voltage required for monitoring a change of an electrochemical characteristic of the electrolyte is applied thereto. The anode 15 is disposed on an outer side surface of the second manifold 13 and maintains charge balance resulting from electron transmission from the cathode 14. A carbon felt or a metal foam may be used as the cathode 14 and the anode 15.

The first end plate 17 may be disposed to be spaced apart from an outer side surface of the cathode 14 through a supporter 16. The second end plate 18 may be disposed to be spaced apart from an outer side surface of the anode 15 through the supporter 16.

Here, the first and second end plates 17 and 18 and the supporter 16 may be fixed by a supporter 19. Here, the separator 11, the first and second manifolds 12 and 13, the cathode 14, and the anode 15 may be accommodated in the supporter 16 and may be fixed by the supporter 19.

In the accelerated lifetime test device 100 for a redox flow battery according to the embodiment of the present invention, a separate electrolyte tank for supplying an electrolyte may not be provided, the test cell 10 including the separator 11 which exchanges ions contained in the electrolyte, the first and second manifolds 12 and 13 which are disposed on both side surfaces of the separator 11 and have openings through which the electrolyte flows, the cathode 14 disposed on the outer side surface of the first manifold 12, the anode 15 disposed on the outer side surface of the second manifold 13, and the first and second end plates 17 and 18 which are respectively disposed on the outer side surfaces of the cathode 14 and the anode 15 may be implemented, and thus charging and discharging times may be reduced by performing charging and discharging through a small amount of electrolyte as compared to the redox flow battery to be tested.

That is, in the accelerated lifetime test device 100 for a redox flow battery according to the embodiment of the present invention, a non-flow battery may be implemented under the same conditions as the redox flow battery to be tested and thus the charging and discharging times may be reduced.

The accelerated lifetime test device 100 for a redox flow battery according to the present invention may include the rotating unit 20 for rotating the test cell 10, and may uniformly disperse the electrolyte inside the test cell 10 by rotating the test cell 10 during the charging and discharging processes.

Figure 7A:
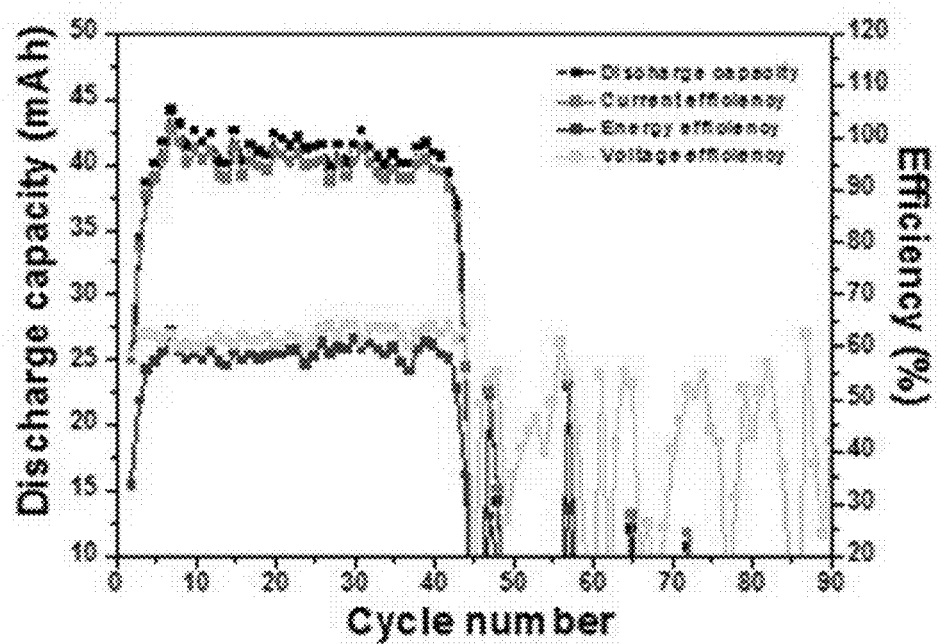
FIG. 7A and FIG. 7B illustrate graphs illustrating results of testing performance of a battery using the accelerated lifetime test device for a redox flow battery according to the embodiment of the present invention.
Figure 7B:
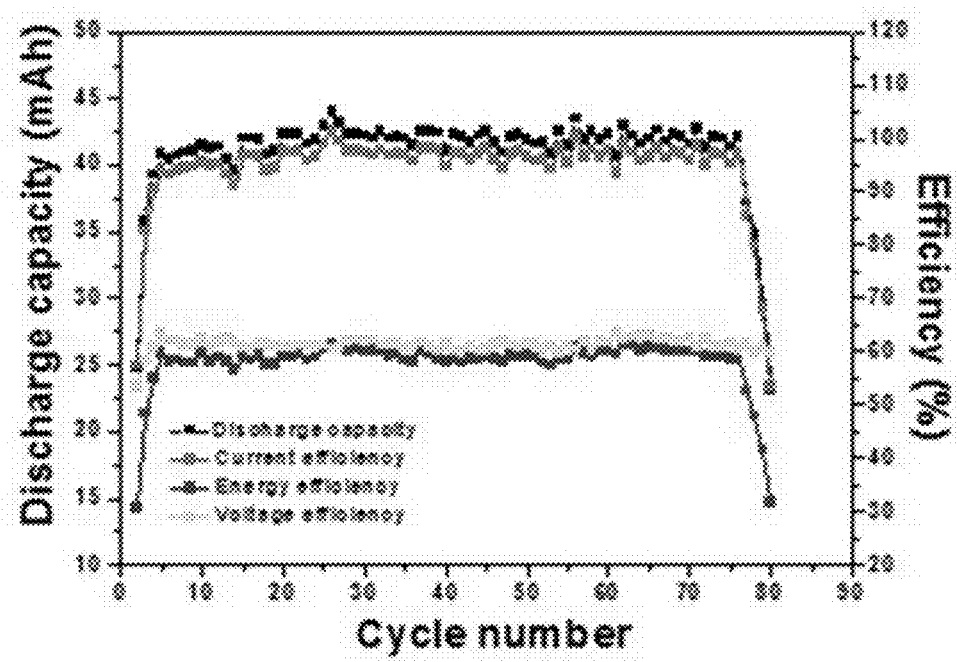

FIG. 7A and FIG. 7B illustrate graphs illustrating results of testing performance of a battery using the accelerated lifetime test device for a redox flow battery according to the embodiment of the present invention.

Referring to FIG. 7A and FIG. 7B, an electrode deactivation test was performed through the accelerated lifetime test device for a redox flow battery according to the embodiment of the present invention.

The cathode and the anode were made of activated carbon. It was confirmed that stabilities of the electrodes were different from each other when TOG-LF and AC-0830, which were the activated carbon, were respectively used as the cathode and the anode.

As a result of experiment, referring to FIG. 7A, it was confirmed that the performance of the test cell was significantly decreased at about the $40^{th}$ cycle when TOG-LF was used.

Also, referring to FIG. 7B, it can be confirmed that the performance of the test cell was significantly decreased at about the $75^{th}$ cycle when AC-0830 was used.

That is, as described above, when the redox flow battery to be tested is directly used to perform a lifetime test on the electrode, much time may be spent performing charging and discharging. For example, when an end cell having an electrode area of 35 $cm^2$ is used, it takes about eight hours or more to charge and discharge SCO up to 40%. Since operations of several hundred cycles or more are generally required in order to confirm electrode deactivation performance under these conditions, there is a problem in that it takes about five months or more for one test of 500 cycles.

However, as the above-described experimental results, when an electrode deactivation test was performed through the accelerated lifetime test device for a redox flow battery according to the embodiment of the present invention, it was confirmed that the experimental results were obtained at the $100^{th}$ cycle or earlier.

Meanwhile, the embodiments disclosed in the drawings are only examples to help understanding of the invention and the invention is not limited thereto. It is clear to those skilled in the art that various modifications based on the technological scope of the invention in addition to the embodiments disclosed herein can be made.

What is claimed is:

1. An accelerated lifetime test device for a redox flow battery, the test device comprising:
a test cell including a separator configured to exchange ions contained in an electrolyte, first and second manifolds disposed on both side surfaces of the separator and having openings through which the electrolyte flows, a cathode disposed on an outer side surface of the first manifold, an anode disposed on an outer side surface of the second manifold, and first and second end plates respectively disposed on outer side surfaces of the cathode and the anode;
a rotator configured to uniformly disperse the electrolyte included in the test cell by rotating the test cell; and
a tester connected to each of the cathode and the anode of the test cell and configured to test performance of the test cell.

2. The test device claim 1, wherein:
an active material of the cathode includes zinc ions; and
an active material of the anode includes bromine ions.

3. The test device claim 1, wherein the rotator includes:
a rotating unit configured to uniformly disperse the electrolyte included in the test cell by rotating the test cell;
a driving unit configured to drive the rotating unit; and
a manipulating unit configured to control an operation of the driving unit.

4. The test device claim 3, wherein the rotating unit rotates the test cell at a speed of 1 to 10,000 rpm within a range from −180 to +180 degrees.

5. The test device claim 4, wherein the rotating unit rotatably moves the test cell 10 left or right at a predetermined angle.

6. The test device claim 5, wherein the rotating unit includes:
a supporter;
a rotating shaft rotatably coupled to the supporter and rotated by the driving unit; and
an accommodation unit fixedly coupled to the rotating shaft and configured to accommodate the test cell.

* * * * *